US012742840B2

(12) United States Patent
Hong et al.

(10) Patent No.: US 12,742,840 B2
(45) Date of Patent: Sep. 22, 2026

(54) COIL, COIL ASSEMBLY AND METHOD

(71) Applicant: FORSCHUNGSZENTRUM JÜLICH GMBH, Jülich (DE)

(72) Inventors: Suk-Min Hong, Würselen (DE); Nadim Joni Shah, Jülich (DE); Chang-Hoon Choi, Jülich (DE); Jörg Felder, Jülich (DE)

(73) Assignee: FORSCHUNGSZENTRUM JÜLICH GMBH, Jülich (DE)

( * ) Notice: Subject to any disclaimer, the term of this patent is extended or adjusted under 35 U.S.C. 154(b) by 199 days.

(21) Appl. No.: 18/651,511

(22) Filed: Apr. 30, 2024

(65) Prior Publication Data

US 2024/0369654 A1 Nov. 7, 2024

(30) Foreign Application Priority Data

May 3, 2023 (DE) ........................ 102023204070.0

(51) Int. Cl.
*G01R 33/34* (2006.01)
*G01R 33/36* (2006.01)

(52) U.S. Cl.
CPC ... *G01R 33/34046* (2013.01); *G01R 33/3678* (2013.01); *G01R 33/3692* (2013.01)

(58) Field of Classification Search
CPC .......... G01R 33/34046; G01R 33/3678; G01R 33/3692
See application file for complete search history.

(56) References Cited

U.S. PATENT DOCUMENTS

| | | | |
|---|---|---|---|
| 4,906,933 A | 3/1990 | Keren | |
| 5,521,506 A | 5/1996 | Misic et al. | |
| 5,777,474 A * | 7/1998 | Srinivasan | G01R 33/422 324/318 |
| 5,980,596 A | 11/1999 | Hershkowitz et al. | |
| 7,227,360 B2 * | 6/2007 | Jevtic | G01R 33/3415 324/318 |
| 9,880,242 B2 * | 1/2018 | Darnell | G01R 33/3415 |
| 2004/0025805 A1 | 2/2004 | Kayahara et al. | |
| 2012/0201092 A1 | 8/2012 | Hatano et al. | |

FOREIGN PATENT DOCUMENTS

| | | |
|---|---|---|
| EP | 1650499 A2 | 4/2006 |
| EP | 1650499 A3 | 6/2009 |
| JP | 2009029680 A | 2/2009 |

(Continued)

OTHER PUBLICATIONS

International Search Report for PCT Application No. PCT/EP2023/081117, dated Jan. 19, 2024, 3 pages.

(Continued)

*Primary Examiner* — Gregory H Curran
(74) *Attorney, Agent, or Firm* — Dickinson Wright PLLC

(57) ABSTRACT

Coils and assemblies for magnetic resonance imaging or spectroscopy, and methods for generating or detecting magnetic fields with coils. The coil includes a first loop and a second loop. The first loop includes one or more capacitors. The second loop includes one or more capacitors. The second loop is connected to the first loop by a conductor. A total capacitance of the first loop is different from a total capacitance of the second loop.

16 Claims, 6 Drawing Sheets

(56) References Cited

FOREIGN PATENT DOCUMENTS

| | | | |
|---|---|---|---|
| WO | 2008104859 | A2 | 9/2008 |
| WO | 2008104859 | A3 | 9/2008 |

OTHER PUBLICATIONS

International Preliminary Report on Patentability for PCT Application No. PCT/EP2023/081117, dated Jul. 3, 2025, 7 pages.
Written Opinion of the International Searching Authority for PCT Application No. PCT/EP2023/081117, dated Jan. 19, 2024, 6 pages.
Anonymous, "TRGS 720: Gefahrliche explosionsfahige Gemische—Allgemeines, 2 Begriffsbestimmungen", Retrieved from the Internet: https://vorschriften.bgn-branchenwissen.de/daten/t r/trgs720/2.htm#23, Jan. 10, 2022 (Jan. 10, 2022), 3 pages.
Zhang et al., "Single-feed quadrature coils as transceiver array elements for improved SNR and transmit efficiency," Proc. Intl. Soc. mag. reson. Med. 17, 2009, 1 page.
Hong et al., "Design of a Folded, Double-Tuned Loop Coil for H/X-Nuclei MRI Applications," IEEE Transactions on Medical Imaging, May 2023, 8 pages, vol. 42, No. 5.

* cited by examiner

COIL, COIL ASSEMBLY AND METHOD

CROSS-REFERENCE TO RELATED APPLICATION(S)

The present application claims priority to and the benefit of German Patent Application No. 102023204070.0, filed May 3, 2023, the entire disclosure of which is hereby incorporated by reference for all purposes.

BACKGROUND

Magnetic resonance imaging (MRI) is a non-invasive imaging method for examining body parts in which sectional images of the body are generated for medical diagnostics. It is based on the resonant excitation of certain atomic nuclei included in the body by means of strong magnetic fields and alternating magnetic fields in the radio frequency range (nuclear magnetic resonance) and the subsequent detection of an electrical signal induced in a receiver circuit. Despite the use of low-energy radio waves with wavelengths in the meter range, high-resolution images can be generated in this way.

SUMMARY

To perform MRI, high-frequency antennas (known as coils in MRI) are used, which are arranged on or around the body to be examined. Different coils can be used for transmitting and receiving, which are then typically designed as pure transmitting or receiving coils. Alternatively, coils can be designed as combined transmitting and receiving coils.

The generated and detected magnetic fields can be linearly or circularly polarized. Corresponding coils are required for this. Linear polarization is technically easy to implement but has the disadvantage that the transmission efficiency is lower compared to circular polarization and the energy required to generate the magnetic fields is higher. The latter is due to the fact that with linear polarization the energy is used to generate the B1+ field as well as the B1− field, whereas with circular polarization the energy is only used to generate the desired B1+ field that contributes to spin excitation. The B1+ field is generally the component that rotates counterclockwise, and the B1− field rotates clockwise.

Different coil types and designs are known, e.g., flat surface coils or volume coils such as birdcage coils, which may be linearly or circularly polarized. In addition, several coils are often combined in a coil assembly (array) to increase sensitivity and enable parallel imaging. These are also referred to as multi-channel coils. Linearly or circularly polarized coils can also be used in coil assemblies.

To achieve circular polarization, two coils offset by 90 degrees may be fed with a phase difference of 90 degrees between the inputs. In the case of a birdcage coil, two geometrically decoupled supplies are present so that quadrature control is possible, for example, by means of a quadrature hybrid. In the case of single-channel surface coils, however, there are no decoupled connections, meaning that it is not possible to use multiple connections in this way.

A type of single-channel surface coil comprises two loops connected by a central conductor. Capacitances (capacitors) are arranged in each of the loops in order to tune the respective loop. The feed is located at the central conductor. The capacitances of the two loops are the same in order to achieve symmetrical tuning so that the resonant frequency of both loops is the same. In this way, the current is divided between the two loops and then combined again. A homogeneous current distribution is achieved. The current in the loops is oppositely aligned or flows in mirror image. In this way, linear polarization is achieved.

The present disclosure provides a coil for magnetic resonance imaging and/or spectroscopy as well as an associated coil assembly, a method, and a use. In particular, the above-mentioned disadvantages are to be eliminated at least in part.

A coil for magnetic resonance imaging and/or spectroscopy serves to solve the task. The coil comprises two loops which are connected to each other by means of a conductor. Each loop comprises at least one capacitance. In particular, a feed of the coil is arranged on the conductor. The capacitances of the two loops are different. At least one capacitance of a first of the two loops differs from the corresponding capacitance of the other of the two loops.

In other words, the two loops are asymmetrically tuned. A coil may be configured in this way can be used as a circularly polarized coil. In this way, a single-channel surface coil is provided as a circularly polarized coil. Some advantages of a circularly polarized coil, such as the high transmission efficiency and the low energy demand, can thus be achieved in a particularly simple technical manner. The phase-shifted feed, which is conventionally required for circular polarization, is no longer necessary. Only a single-channel coil and therefore only one feed is needed. Quadrature control is not necessary. The coil according to the present disclosure can be described as an intrinsically circularly polarized coil.

In particular, each loop is suitable for transmitting or generating and/or detecting magnetic fields, for example nuclear magnetic resonance signals. The loop serves as a coil former. A loop can also be referred to as a conductor loop. A loop can be a wire loop, for example. Such a coil composed of two interconnected loops is also known as a butterfly coil. In particular, the coil is a high-frequency coil.

Each loop can form a closed circuit. This means that current can flow in each loop independently of the other loop. Each loop forms a conductor structure. In particular, each loop is flat. In particular, each loop is arranged in a plane or spans a plane. The assembly of the two loops with the conductor between them can also be referred to as a two-by-one conductor network.

The conductor connects the two loops to each other in an electrically conductive manner. The conductor is therefore part of the first loop and at the same time part of the second loop. In particular, the conductor is therefore a common conductor. The conductor divides the electrical conductor of the coil into the first loop and the second loop. For this reason, the conductor can also be referred to as inner conductor. An inner conductor is a conductor located internally. The conductor is located inside the coil and/or inside the outer extension of the coil. The coil therefore extends beyond the conductor in several directions. There is a first node at which the conductor makes electrically conductive contact with the first loop and the second loop. There is a second node at which the conductor makes electrically conductive contact with the first loop and the second loop. The conductor is an electrical conductor.

The conductor may be located within the area of the loops and/or arranged in the plane of the loops between the loops. The feed of the coil is preferably located on the conductor, for example essentially at its center point. Electrical connections are typically provided on the conductor for this purpose. There is preferably a single feed for both loops. The coil is therefore also referred to as a single-channel coil. A feed is used to conduct electrical signals to and/or from the coil.

Different electrical components can be arranged on or in the loops, typically between individual sections of the loops. At least one and in particular several capacitances, especially capacitors, are arranged in each loop. A capacitance is used to influence a resonant frequency of the resonator, for example, to influence the frequency or resonant frequency of the coil. The capacitance is principally electrically conductively connected to the conductor material forming the loop, in particular in series. The capacitance is therefore part of the circuit of the respective loop. In one implementation, the respective sum of the capacitances of the two loops is different. Due to the different capacitances of the two loops, the resonant frequency of the two loops is different. In particular, at each position at which a capacitance is arranged in the first loop, a capacitance is also arranged in the second loop.

The resonant frequency of a resonator is determined by its inductance and capacitance, both of which depend on the geometry and the components and materials used. Each loop comprises at least one capacitance arranged in or on the loop and is thus an at least partially independent resonator or resonant circuit. In particular, each capacitance comprises at least one capacitor. The size of the loop influences the inductance and thus also the resonant frequency of the resonator. Due to the different capacitances, there is a phase difference between the two loops. The current does not flow in mirror image, as is the case with conventional butterfly coils, in which the current is divided equally between the two loops and then combined. According to the present disclosure, the current flows at different times.

Each loop can also have one or more inductances (inductors) to influence the transmitting and/or receiving frequency and/or for tuning purposes.

One or more inductances can also be arranged in or on each loop. Inductances are typically connected in series with the capacitances and/or sections of the loops. The presence and values of the inductances depend on geometric conditions, such as the size of the loops, the length or diameter of the lines, etc. If the two loops have the same structure, the inductances in particular are also the same.

In one implementation, at least one of the two loops comprises a plurality of capacitances. In particular, each of the two loops comprises a plurality of capacitances. The sum of all the capacitances of the two loops are different. The sum of all the capacitances of the first loop therefore differs from the sum of all the capacitances of the second loop. This is a particularly useful way of achieving circular polarization.

In one implementation, the capacitances of the two loops have a difference of at least 8 megahertz or at least 2.5 percent.

According to the present disclosure, the percentage difference relates to the larger of the two capacitances. Alternatively, the difference should be at least 4 megahertz or at least 1.3 percent. In some implementations, the difference is at least 16 megahertz or at least 5 percent. This configuration ensures that the difference is sufficiently large to achieve a sufficiently large phase shift between the two loops. The difference refers in particular to the sum of the capacitances of each loop.

The aforementioned lower limits of the absolute and relative difference are advantageous, but not absolutely necessary for solving the task, depending on the actual implementation of the coil. However, it is advantageous to select the difference in such a way that there is a sufficiently large phase shift between the two loops so that the coil can be operated effectively in a circularly polarized mode. This can be used to determine the lower limit of the difference.

In some implementations, the capacitances of the two loops have a difference of at most 64 megahertz or at most 20 percent.

Alternatively, the difference is at most 128 megahertz or at most 40 percent. In some implementations, the difference is at most 48 megahertz or at most 15 percent. In other implementations, the difference is at most 32 megahertz or at most 10 percent. It is ensured by this configuration that the difference does not become excessive, so that a sufficiently large overlap area between the resonance peaks consists. In other words, it is ensured that the reflection coefficient S11 (input reflection coefficient) does not become too small.

The aforementioned upper limits of the absolute and relative difference are advantageous, but not absolutely necessary for solving the task, depending on the actual implementation of the coil. However, it is advisable to select the difference in such a way that a reflection coefficient S11 exists which is sufficient for the feed, at least a reflection coefficient S11 not equal to zero. This can be used to determine the upper limit of the difference.

In one implementation, the capacitances of the two loops are selected such that there is a phase shift of approximately 90 degrees in the unloaded state. The phase shift refers to the shift of the phase of the first of the two loops in relation to the second of the two loops. The phase shift relates in particular to the current flow through the loops.

The selection of one or more capacitances may comprise the selection of the size, implementation and/or assembly of a capacitance. The selection may comprise the positioning or distribution of multiple capacitances. The selection may comprise the assembly of capacitances of a certain size at certain positions. The assembly of a capacitance may relate to an absolute position in the loop and/or to a relative position in relation to one or more other components, such as other capacitances, inductances or nodes, for example, with the conductor.

The unloaded state refers to the state in which an object to be examined is not present or is not arranged on the coil. A slight deviation of 10 degrees or 5 degrees is still acceptable. In the loaded state, for example, when an object to be examined such as a body, body part or phantom is present, a larger deviation can occur. In this implementation, a circularly polarized signal can be transmitted and/or received particularly effectively.

In one implementation, the loops are designed symmetrically. The loops can be arranged axially symmetrically in relation to a central axis of the coil, for example, symmetrically opposite each other. In this case, the conductor is designed as a central conductor (centrally arranged conductor). The conductor is located centrally between the two loops along the axis of symmetry and divides the coil into two loops of equal size. In particular, the loops have the same structure and are arranged axially symmetrically, differing only in their different capacitances. For example, the loops can be rectangular or square. In one implementation, the coil may be square, and the two loops have such a rectangular shape that together they form the square.

Alternatively, it is also possible for the conductor to be on one side or the other. In one exemplary implementation, the coil comprises an area of 10 centimeters by 10 centimeters. In a first variant, the conductor divides the coil into two different sized loops, wherein a first loop has an area of 3 centimeters by 10 centimeters, and a second loop has an area of 7 centimeters by 10 centimeters. In this case, the loops are not designed symmetrically. In a second variant, the conductor is a central conductor and divides the coil into two loops of equal size, each with an area of 5 centimeters by 10 centimeters. The operation of the coil and the average values of the coil were almost identical in both variants.

Even if the loops are arranged mirrored on a central conductor, the loops do not have to be designed in a similar way. For example, the loops can have different materials and/or components. However, a similar implementation of the two loops, apart from the different capacitances, is expedient. In this case, all properties and components of the two loops correspond to each other or are identical.

In one implementation, the capacitances of the two loops are selected such that the B1+ field is larger than the B1− field. In this implementation, the coil is used in particular as a transmitting coil. The B1+ field contributes to the spin excitation, while the B1− field determines the strength of the MR received signal. In the sense of the best possible energy efficiency of a transmitting coil, a large B1+ field may be used. Due to the implementation of the coil according to the present disclosure, it is possible for the first time to decouple the field strengths. In contrast to other coils, in which the B1+ field and the B1− field have opposite signs but were of the same magnitude, a comparatively strong B1+ field can be generated here by selecting the appropriate capacitances of the two loops.

In one implementation, the B1+ field is larger than the B1− field by a factor of at least 2. In one implementation, the B1+ field is larger than the B1− field by at least a factor of 1.5, 3, or 5. The factor may be less than 50. In this way, the coil can be operated in a particularly energy-efficient manner.

In one implementation, the capacitances of the two loops are selected such that the B1− field is larger than the B1+ field. In this implementation, the coil is used in particular as a receiving coil. In the sense of the best possible reception, a large B1− field is desirable.

In one implementation, the B1− field is larger than the B1+ field by a factor of at least 2. In one implementation, the B1− field is larger than the B1+ field by at least a factor of 1.5, 3, or of 5. The factor may be less than 50. In this way, the coil can receive particularly effectively.

In one implementation, the coil is designed as a pure receiving coil. This is particularly practical. A pure receiving coil is not configured to transmit signals or generate magnetic fields, such as those required for MRI or MRS. A separate transmitting coil is required for this.

In particular, the receiving coil therefore has no switch for switching between transmitting and receiving functions, no power divider for dividing the transmitting power or for adapting the transmitting phases, no transmitting current source or power amplifier and/or no phase shifter to protect the preamplifier. Thus, the receiving coil according to the disclosure is cheaper and easier to manufacture than a combined transmitting and receiving coil with the same number of channels. Of course, it is not excluded that a power divider is used to combine the receive signal of several preamplifiers, in particular in a receive coil assembly with several receive coils.

Alternatively, the coil may be a combined transmitting and receiving coil. In this case, the coil can in particular be operated in a transmitting mode and a receiving mode. The coil can be a pure transmitting coil.

A further aspect of the present disclosure is a coil assembly for magnetic resonance imaging and/or spectroscopy. The coil assembly comprises a plurality of coils according to the present disclosure.

The coil assembly allows the assembly of a number and possibly shape and/or size of coils adapted to the respective field of application, in other words it is a personalized coil assembly. A coil assembly is also referred to as a multi-channel coil, wherein one channel corresponds to a coil according to the disclosure. Accordingly, for small bodies or body parts to be examined, fewer and/or smaller coils can be provided, while for larger bodies or body parts to be examined, more and/or larger coils can be provided. The coil assembly may be a transmitting coil assembly and/or a receiving coil assembly. All features, advantages and implementation of the coil described above also apply to the coil assembly and vice versa.

A further aspect of the present disclosure is a method for generating and/or detecting a magnetic field, in which a circularly polarized magnetic field is generated and/or detected by means of a coil according to the disclosure.

Detecting a magnetic field means detecting at least one property of a magnetic field, in particular when performing magnetic resonance imaging and/or spectroscopy. All features, advantages and implementation of the coil described above, and the coil assembly also apply to the method and vice versa.

In one implementation, the coil is used as a receiving coil and the capacitances of the two loops are selected such that the B1− field is larger than the B1+ field. The coil can be a pure receiving coil or a combined transmitting and receiving coil in a receiving mode.

In one implementation, the coil is used as a transmitting coil and the capacitances of the two loops are selected so that the B1+ field is larger than the B1− field. The coil can be a pure transmitting coil or a combined transmitting and receiving coil in transmitting mode.

A further aspect of the present disclosure is the use of a coil according to the disclosure as a circularly polarized coil.

In particular, the coil is used in a magnetic resonance imaging and/or spectroscopy system. All the features, advantages and implementations of the coil described at the beginning and of the coil assembly and method also apply to the use and vice versa.

BRIEF DESCRIPTION OF THE DRAWINGS

For a detailed description of example implementations, reference will now be made to the accompanying drawings in which.

DETAILED DESCRIPTION

Figure 1A:
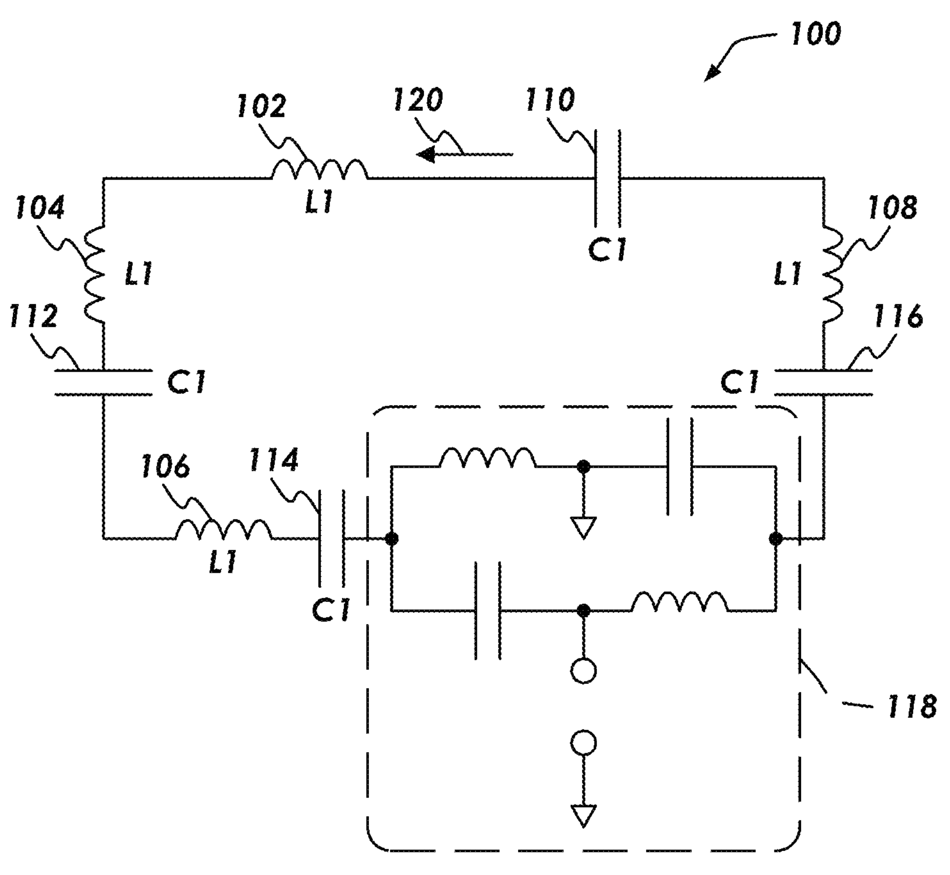
FIG. 1A is a circuit diagram of an example of a loop coil in accordance with some implementations.
Figure 1B:
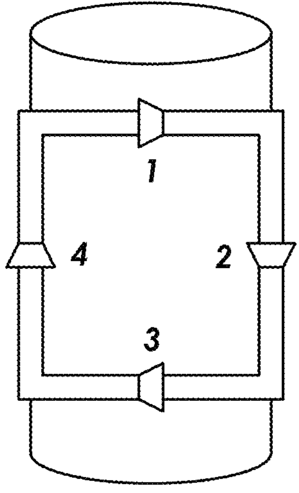
FIG. 1B is a diagram of an example of a simulation model of the loop coil of FIG. 1A in accordance with some implementations.

FIG. 1A is a circuit diagram of an example of a loop coil 100. The loop coil 100 illustrated in FIG. 1A includes four inductors 102, 104, 106, and 108, four capacitors 110, 112, 114, and 116, and a feed 118. The four inductors 102, 104, 106, and 108 and the four capacitors 110, 112, 114, and 116 are arranged in a rectangular loop coil and connected by means of an electrical conductor. The feed 118 is arranged on the electrical conductor. Current flow inside the loop coil 100 is in the direction of arrow 120. The loop coil 100 is suitable for use in magnetic resonance imaging, spectroscopy, or both. The four inductors 102, 104, 106, and 108 each have a first inductance L1. The four capacitors 110, 112, 114, and 116 each have a first capacitance C1. In some implementations, the first capacitance C1 is approximately 4.6 picofarads. In some implementations, the loop coil 100 has a length of approximately 10 centimeters and a width of approximately 10 centimeters. In some implementations, the frequency is 300 megahertz (corresponding, for example, to a static field strength of 7 T of an underlying MRI device). FIG. 1B is a diagram of an example of a simulation model of the loop coil 100.

Figure 1C:
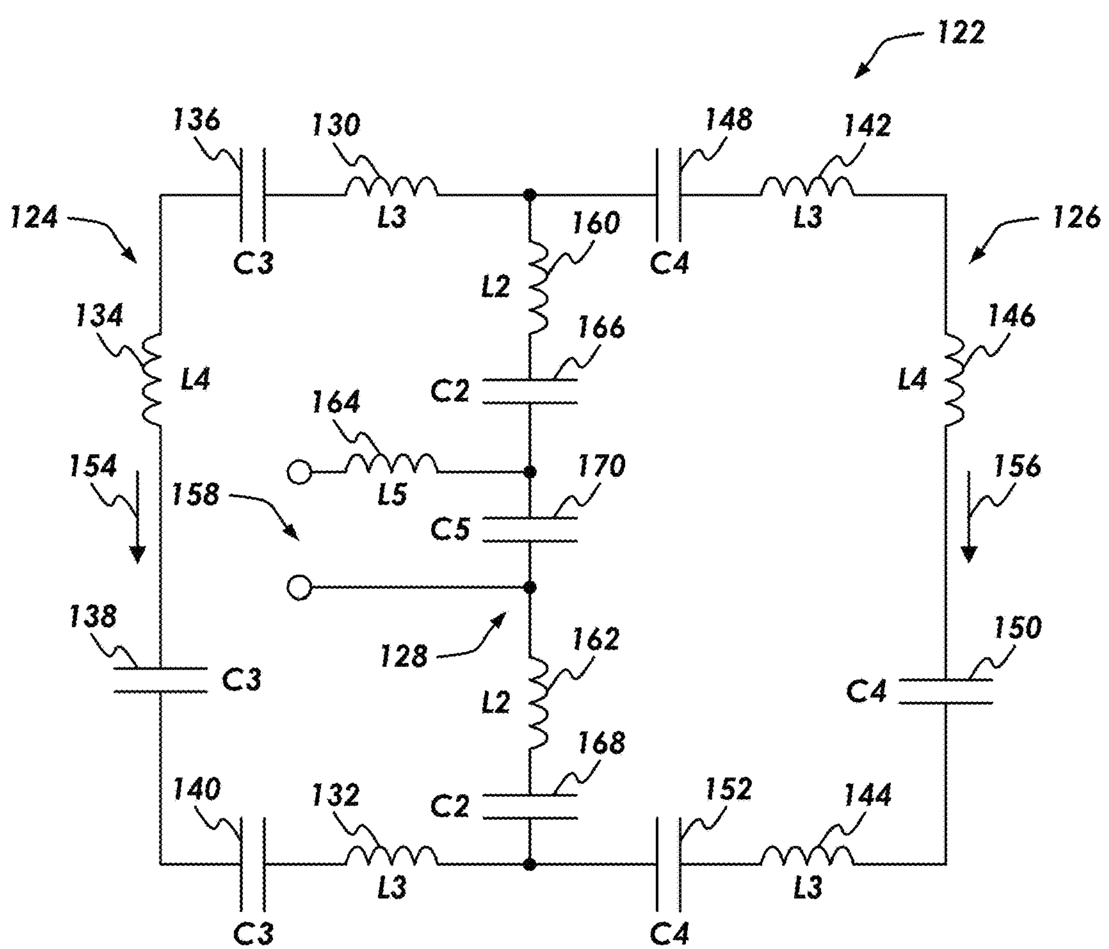
FIG. 1C is a circuit diagram of an example of a butterfly coil in accordance with some implementations.

FIG. 1C is a circuit diagram of an example of a butterfly coil 122. The butterfly coil 122 illustrated in FIG. 1C includes a left loop 124, a right loop 126, and a central inner conductor 128. The central inner conductor 128 electrically connects the left loop 124 and right loop 126 with each other. The left loop 124 and the right loop 126 have the same structure and are arranged axially symmetrically in relation to the central inner conductor 128. The left loop 124 illustrated in FIG. 1C includes three inductors 130, 132, and 134 and three capacitors 136, 138, and 140. The right loop 126 illustrated in FIG. 1C includes three inductors 142, 144, and 146 and three capacitors 148, 150, and 152. Current flows inside the left loop 124 in the direction of arrow 154. Current flows inside the right loop 126 in the direction of arrow 156. The current flow in the left loop 124 asymmetrically mirrors the current flow in the right loop 126. The central inner conductor 128 illustrated in FIG. 1C includes a feed 158, three inductors 160, 162, and 164, and three capacitors 166, 168, and 170. Inductor 164 and capacitor 170 are positioned in the area of the feed 158. Inductors 160 and 162 each have a second inductance L2. Inductors 130, 132, 142, and 144 each have a third inductance L3. Inductors 134 and 146 each have a fourth inductance L4. Inductor 164 has a fifth inductance L5. Capacitors 166 and 168 each have a second capacitance C2. Capacitors 136, 138, and 140 each have a third capacitance C3. Capacitors 148, 150, and 152 each have a fourth capacitance C4. Capacitor 170 has a fifth capacitance C5. In some implementations, the butterfly coil 122 has a length of 10 centimeters, a width of 10 centimeters, and a frequency of 300 megahertz.

In some coil tuning, the inductances of the inductors and the capacitances of the capacitors may be adjusted so that the imaginary part of the impedance is canceled out:

$$Z = RI + j\left(wL - \frac{1}{wC}\right)I$$

The loop coil 100 in FIG. 1A may be tuned by canceling out the first inductance L1 of the four inductors 102, 104, 106, and 108 by the first capacitance C1 of the four capacitors 110, 112, 114, and 116. For example, the first inductance L1 may be approximately 250 nanohenries.

In a first implementation of the butterfly coil 122 in FIG. 1C, the third capacitance C3 of the capacitors 136, 138, and 140 in the left loop 124 and the fourth capacitance C4 of the capacitors 148, 150, and 152 in the right loop 126 may be the same. In some implementations, the second capacitance C2 is approximately 23 picofarads, the third capacitance C3 is approximately 6 picofarads, and the fourth capacitance C4 is approximately 6 picofarads. The left loop 124 of the butterfly coil 122 of FIG. 1C may be tuned by canceling the inductance using the capacitances of capacitors 136, 138, 140, 166, and 168. For example, the total inductance of the left loop 124 may be approximately 165 nanohenries (2×L2+2×L3+L4). The right loop 126 may be tuned by canceling the same inductance using the capacitances of capacitors 148, 150, 152, 166, and 168. For example, the total inductance of the right loop 126 may be approximately 165 nanohenries (2×L2+2×L3+L4). Accordingly, the third capacitance C3 may be equal to the fourth capacitance C4. This means that the impedances are identical and have no imaginary part. The left loop 124 and the right loop 126 are therefore tuned with identical values. As a result, the current in the left loop 124 and the current in the right loop 126 have the same magnitude and phase, but flow in the opposite direction, as shown by the arrows 154 and 156. The butterfly coil 122 is linearly polarized in the first implementation.

In a second implementation of the butterfly coil 122 in FIG. 1C, the third capacitance C3 of capacitors 136, 138, and 140 in the left loop 124 and the fourth capacitance C4 of capacitors 148, 150, and 152 in the right loop 126 are different. The total inductance of the right loop 126 of the butterfly coil 122 may not be canceled out by the capacitances of capacitors 148, 150, 152, 166, and 168. For example, the second capacitance C2 may be approximately 25 picofarads, the third capacitance C3 may be approximately 6.4 picofarads, and the fourth capacitance C4 may be approximately 7.8 picofarads. The third capacitance C3 and the fourth capacitance C4 are therefore different. In this example, the imaginary impedance of the right loop 126 is about 57 ohms higher than that of the left loop 124.

The phase of the current can be calculated using the ratio between the real part and the imaginary part of the impedance:

$$\frac{j}{R}\left(wL - \frac{1}{wC}\right)\frac{j}{R}\left(wL - \frac{1}{wC}\right)$$

The resistance R summarizes the ohmic loss of conductors and the resistance caused by loading with a lossy object to be examined. For example, the ohmic loss of the butterfly coil 122 is almost zero ohms, so that the phase difference between the left loop 124 and the right loop 126 is almost 90 degrees in the unloaded state. In the aforementioned implementation, the load resistance may be around 15 ohms and the corresponding phase difference may be around 75 degrees.

In some implementations, the difference between the frequencies of the right loop 126 and the left loop 124 may be 16 megahertz. These generate an imaginary impedance of approximately 50 ohms. The load resistance or effective resistance in the present exemplary implementation is approximately 15 ohms. The phase difference of the current is determined by the ratio between the effective resistance and the imaginary impedance.

In some implementations, the left loop 124 and the right loop 126 may be tuned differently (e.g., to different frequencies). Therefore, the current flow in the left loop 124 and the current flow in right loop 126 may not be identical and simultaneous, but the current represented by current flow in the left loop 124 and current flow in the right loop 126 may flow at different times, as shown in detail in FIG. 3 and the associated description. In other words, there is a phase difference. The butterfly coil 122 is circularly polarized in the second implementation.

Figure 1D:
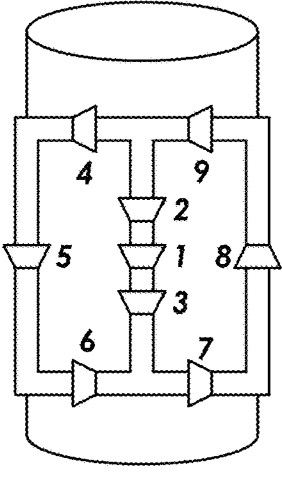
FIG. 1D is a diagram of an example of a simulation model of the butterfly coil of FIG. 1C in accordance with some implementations.

The simulation model of the loop coil 100 is shown in FIG. 1B. The simulation model of the butterfly coil 122 is shown in FIG. 1D. The capacitances (50-ohm connections in the simulation, for example using CST) are shown as trapezoidal symbols.

All coils were loaded with a cylindrical phantom. For example, a diameter of approximately 11 centimeters, a length of approximately 20 centimeters, dielectric constant of approximately 80, and a conductivity of approximately 1 S/m. The values of the individual capacitances were as indicated above. The current distribution and the B1 field efficiency of loop coil 100, the first implementation of the butterfly coil 122, and the second implementation of the butterfly coil 122 were compared.

Figure 2A:
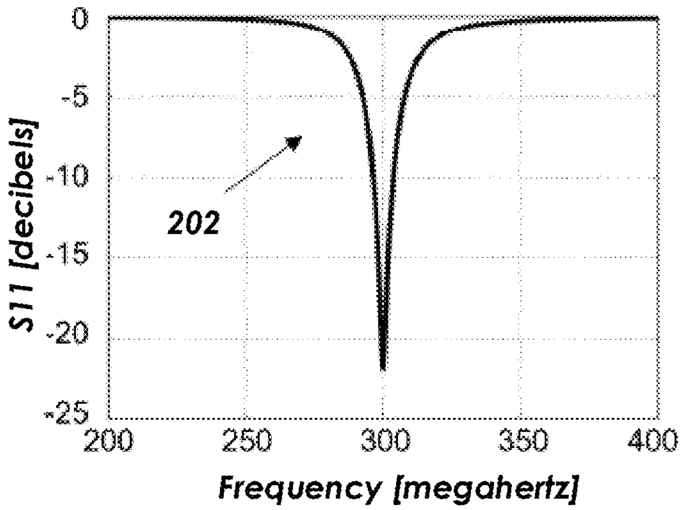
FIG. 2A is a graph of an example of simulated input reflection coefficients of a linearly polarized butterfly coil in accordance with some implementations.
Figure 2B:
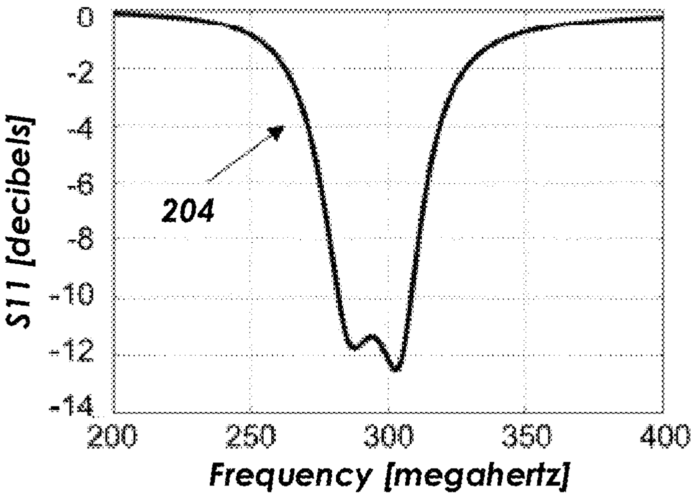
FIG. 2B is a graph of an example of simulated input reflection coefficients of a circularly polarized butterfly coil in accordance with some implementations.

FIG. 2A is a graph of an example of simulated input reflection coefficients S11 of a linearly polarized butterfly coil 202 in accordance with the first implementation of the butterfly coil 122 described above. FIG. 2B is a graph of an example of simulated input reflection coefficients S11 of a circularly polarized butterfly coil 204 in accordance with the second implementation of the butterfly coil 122 described above. The circularly polarized butterfly coil 204 is asymmetrically tuned. Therefore, the resonance peak of the circularly polarized butterfly coil 204 is split. The frequencies to which the left loop 124 and the right loop 126 of the butterfly coil 122 according to the second implementation are tuned to approximately 288 megahertz and approximately 304 megahertz in the some implementations, and thus differ by 16 megahertz. The absolute value of the S11 values is approximately 12 decibels at the peak for the circularly polarized butterfly coil 204 according to the present disclosure and thus lower than for the linearly polarized butterfly coil 202 having approximately 22 decibels.

In some implementations, the circularly polarized butterfly coil 204 may be configured such that the absolute value of the input reflection coefficient S11 is at least 2 decibels. In other implementations, the circularly polarized butterfly coil 204 may be configured such that the absolute value of the input reflection coefficient S11 is at least 5 decibels. In other implementations, the circularly polarized butterfly coil 204 may be configured such that the absolute value of the input reflection coefficient S11 is at least eight decibels. In other implementations, the circularly polarized butterfly coil 204 may be configured such that the absolute value of the input reflection coefficient S11 is at least 10 decibels. This generally refers to the maximum and/or to the reflection coefficient S11 at the midpoint between the differences of the left loop 124 and the right loop 126.

Figure 3:
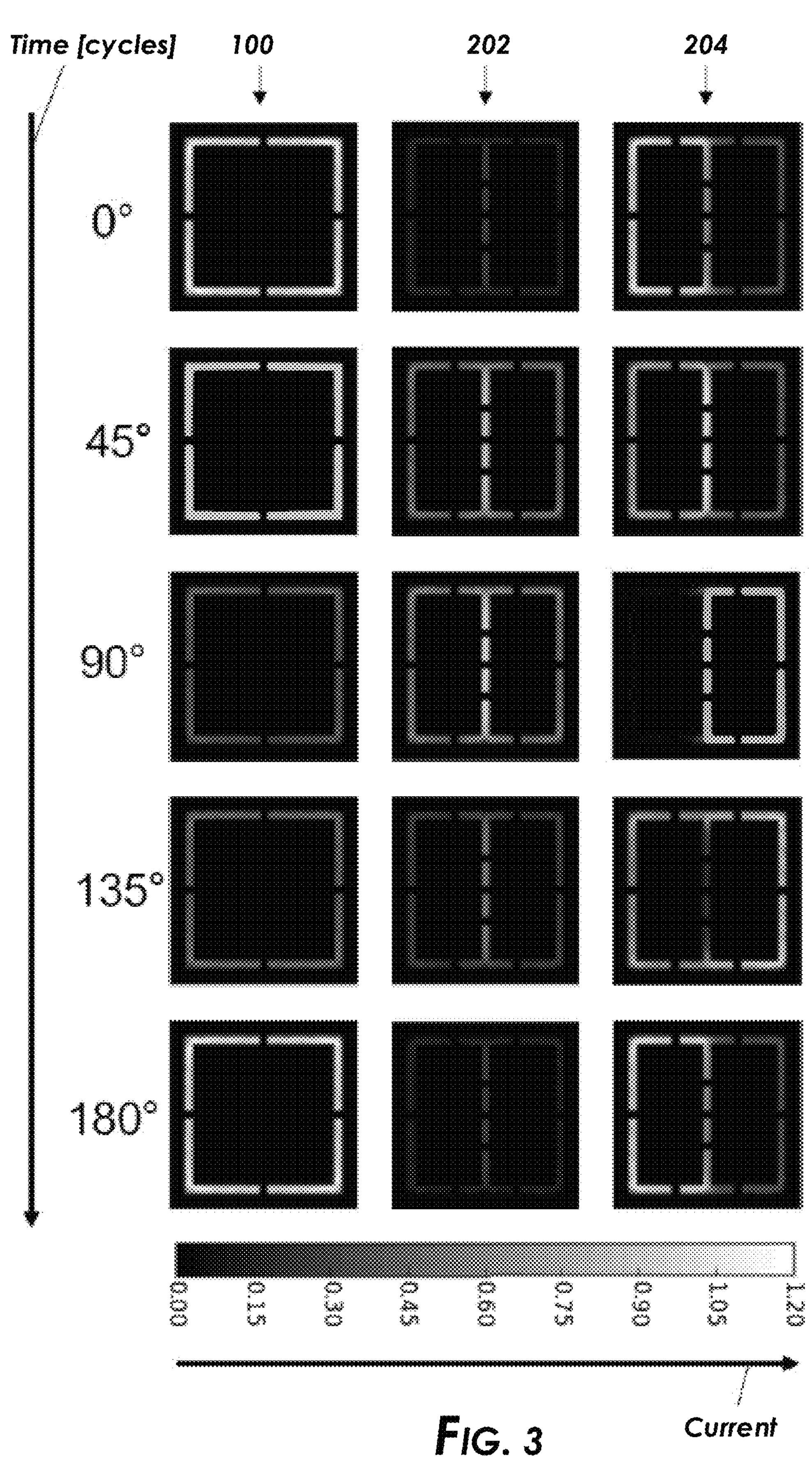
FIG. 3 show examples of snapshots of current distributions of a loop coil, a linearly polarized butterfly coil, and a circularly polarized butterfly coil at different phases of an input signal in accordance with some implementations.

FIG. 3 shows examples of snapshots of current distributions of the loop coil 100, the linearly polarized butterfly coil 202, and the circularly polarized butterfly coil 204 at different phases of the input signal (e.g., at different points in time within a period as an indication of time). The current distribution and power characteristics were calculated using FIT simulation from the simulation models shown in FIGS. 1B and 1D. The brighter the area of the conductor shown, the higher is the current flow.

The loop coil 100 and the linearly polarized butterfly coil 202 provide an asymmetrical current distribution over time. The left loop 124 and the right loop 126 of the circularly polarized butterfly coil 204, on the other hand, are activated and deactivated (e.g., switched on and off) with different phases. The phase delay (e.g., phase shift) between the left loop 124 and right loop 126 of the circularly polarized butterfly coil 204 is approximately 70 degrees. The effect according to the present disclosure is illustrated in FIG. 3.

Figure 4:
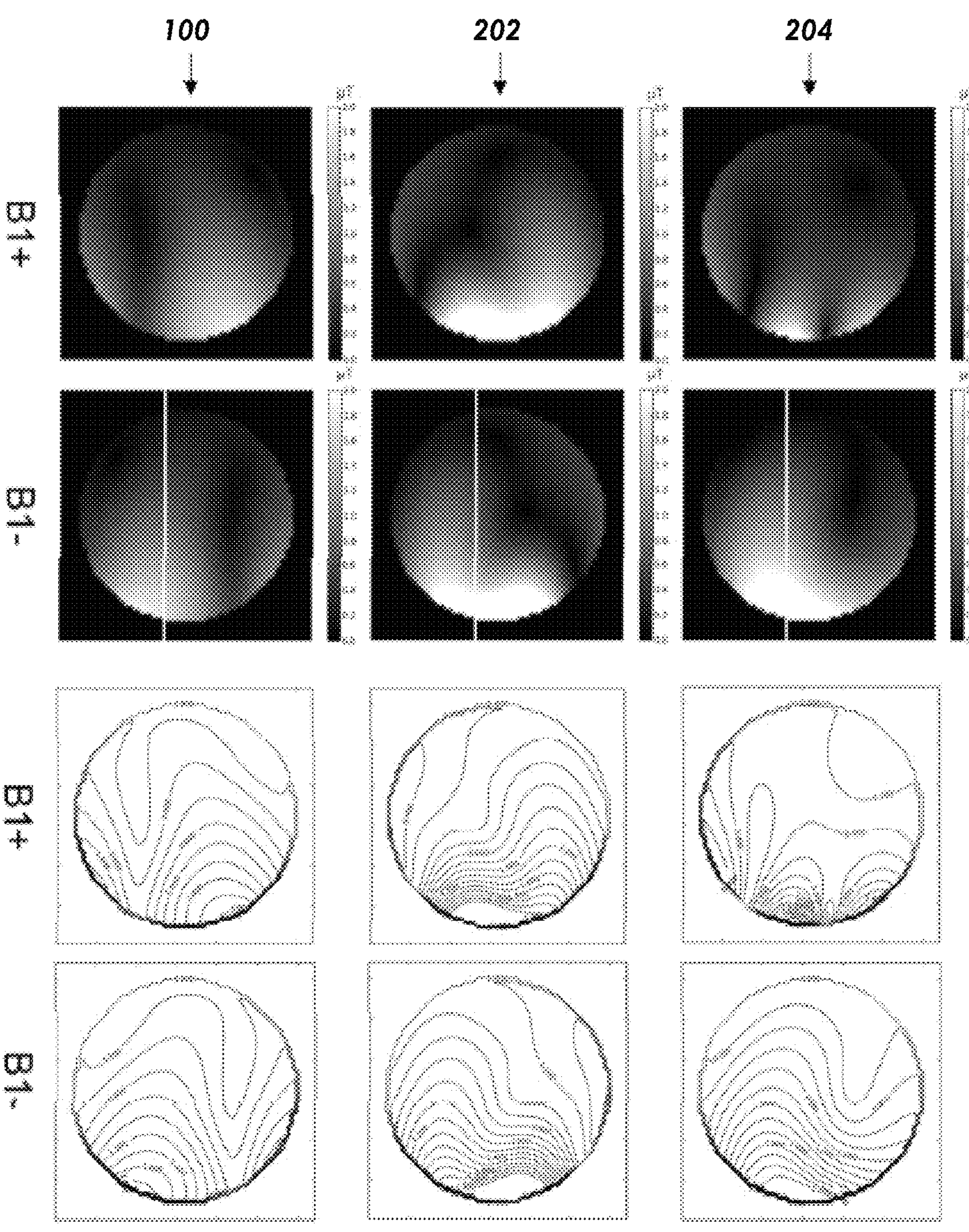
FIG. 4 shows examples of B1+ and B1− field efficiency of a loop coil, a linearly polarized butterfly coil, and a circularly polarized butterfly coil in accordance with some implementations.

FIG. 4 shows example of B1+ and B1− field efficiency (e.g., level of the magnetic fields) generated by loop coil 100, the linearly polarized butterfly coil 202, and the circularly polarized butterfly coil 204. The top six figures show the simulated values, and the bottom six figures show contour lines calculated from them. Both the loop coil 100 and the linearly polarized butterfly coil 202 produce B1+ and B1− field distributions of identical size, but mirrored in the left and right directions. In contrast, the fields of the circularly polarized butterfly coil 204 are decoupled. The circularly polarized butterfly coil 204 provides a significantly stronger B1 field than the B1+ field and the distribution pattern does not exhibit any mirrored properties. The aforementioned properties of the respective B1 fields can be visually compared using the contour lines. This configuration is particularly advantageous when the coil is used as a receiving coil, as the B1− field determines the strength of the received MR signal.

The loop coil 100, the linearly polarized butterfly coil 202, and the circularly polarized butterfly coil 204 provide an average B1 field efficiency of 0.59 microteslas (μT), 0.73 microteslas and 0.76 microteslas, respectively. These values are normalized by the square root of the accepted power in order to be able to compare the performance of the different coils. Alternatively, the input power may also be used for normalization.

In some implementations, the third capacitance C3 is approximately 6.1 picrofarads, and the fourth capacitance C4 is approximately 7.8 picrofarads. In other implementations, the circularly polarized butterfly coil 204 may also be tuned differently from these values. In the event that third capacitance C3 is higher than four capacitance C4 (e.g., the third capacitance C3 is approximately 7.8 picofarads and fourth capacitance C4 is approximately 6.1 picofarads), the polarity changes and the B1+ field becomes a B1− field and vice versa. In this case, circularly polarized butterfly coil 204 may provide a higher B1+ field than a B1− field. This is particularly desirable when the coil is used as a transmitting coil, as the B1+ field contributes to spin excitation as described.

Figure 5A:
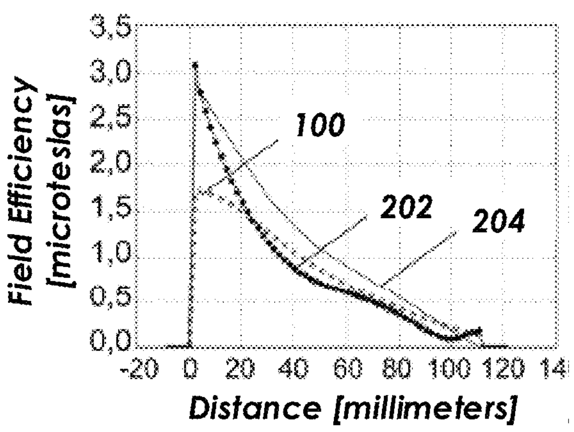
FIG. 5A is a graph of examples of B1 field efficiency profiles of a loop coil, a linearly polarized butterfly coil, and a circularly polarized butterfly coil in accordance with some implementations.

FIG. 5A is a graph of examples of B1 field efficiency profiles of the loop coil 100, the linearly polarized butterfly coil 202, and the circularly polarized butterfly coil 204 of FIG. 4 along the center axis shown in FIG. 4 by means of a vertical line as field efficiency in microteslas, plotted over the distance from the coil in millimeters and/or the penetration depth in millimeters. The linearly polarized butterfly coil 202 provides a higher average B1 efficiency than the loop coil 100 but shows a strong concentration only in the vicinity of the coil and a lower penetration depth than the loop coil 100. In contrast, the circularly polarized butterfly coil 204 provides not only a greater average B1 efficiency but also a greater penetration depth.

Figure 5B:
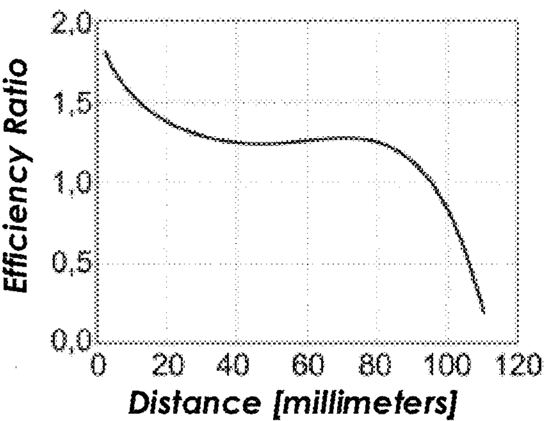
FIG. 5B is a graph of example of dimensionless efficiency ratios of a circularly polarized butterfly coil and a loop coil in accordance with some implementations.

FIG. 5B is a graph of example of dimensionless efficiency ratios of the circularly polarized butterfly coil 204 and loop coil 100. As illustrated in FIG. 5B, the circularly polarized butterfly coil 204 achieves a greater field efficiency than the loop coil 100 up to a penetration depth greater than 90 millimeters.

In both cases, the profile extends to a distance of 110 millimeters, as this corresponds to the diameter of the phantom used.

In some implementations, the butterfly coil 122 may be a coil for a combined 1H/x-nuclei imaging system. Many different 1H/x-nuclei systems are possible. For example, the butterfly coil 122 may be a coil for a combined 1H/19F imaging system. In this case, the difference of the resonance frequencies is approximately 6 percent. In other words, the capacitances of the left loop 124 and the right loop 126 may have a difference of approximately 6 percent. Thus, the left loop 124 and the right loop 126 may be asymmetrically tuned or double tuned. The split resonance peak of the circularly polarized butterfly coil 204 may support the 1H/19F application.

What is claimed is:

1. A coil for magnetic resonance imaging or spectroscopy, comprising:

a first loop including one or more capacitors arranged in the first loop; and a second loop connected to the first loop by a central inner conductor and including one or more capacitors arranged in the second loop, wherein the central inner conductor is part of the first loop and part of the second loop between a first node and a second node, wherein a total capacitance of the first loop is a sum of the one or more capacitors arranged in the first loop and a total capacitance of the second loop is a sum of the one or more capacitors arranged in the second loop, and wherein the total capacitance of the first loop is different from the total capacitance of the second loop.

2. The coil according to claim 1, wherein the first loop further includes a plurality of capacitors, and wherein the second loop further includes a plurality of capacitors.

3. The coil according to claim 1, further comprises a feed arranged on the central inner conductor.

4. The coil according to claim 1, wherein the total capacitance of the first loop and the total capacitance of the second loop are such that respective resonant frequencies of the first loop and the second loop have a difference of at least 8 megahertz or at least 2.5 percent.

5. The coil according to claim 1, wherein the total capacitance of the first loop and the total capacitance of the second loop are such that respective resonant frequencies of the first loop and the second loop have a difference of at most 64 megahertz or at most 20 percent.

6. The coil according to claim 1, wherein the total capacitance of the first loop and the total capacitance of the second loop are configured such that in an unloaded state there is a phase shift of approximately 90 degrees.

7. The coil according to claim 1, wherein the first loop and the second loop are configured symmetrically.

8. The coil according to claim 1, wherein the total capacitance of the first loop and the total capacitance of the second loop are selected such that a B1+ field is larger than a B1− field.

9. The coil according to claim 8, wherein the B1+ field is larger than the B1− field by at least a factor of 2.

10. The coil according to claim 1, wherein the total capacitance of the first loop and the total capacitance of the second loop are configured such that a B1− field is greater than a B1+ field.

11. The coil according to claim 10, wherein the B1− field is larger than the B1+ field by at least a factor of 2.

12. The coil according to claim 1, wherein the coil is a circularly polarized coil.

13. An assembly for magnetic resonance imaging or spectroscopy, comprising a plurality of coils, wherein each of the plurality of coils including:

a first loop including one or more capacitors arranged in the first loop, and a second loop connected to the first loop by a central inner conductor and including one or more capacitors arranged in the second loop, wherein the central inner conductor is part of the first loop and part of the second loop between a first node and a second node, wherein a total capacitance of the first loop is a sum of the one or more capacitors arranged in the first loop and a total capacitance of the second loop is a sum of the one or more capacitors arranged in the second loop, and wherein the total capacitance of the first loop is different from the total capacitance of the second loop.

14. A method for generating or detecting magnetic fields, comprising:

generating a circularly polarized magnetic field using a coil including:

a first loop including one or more capacitors arranged in the first loop, and a second loop connected to the first loop by a central inner conductor and including one or more capacitors arranged in the second loop, wherein the central inner conductor is part of the first loop and part of the second loop between a first node and a second node, wherein a total capacitance of the first loop is a sum of the one or more capacitors arranged in the first loop and a total capacitance of the second loop is a sum of the one or more capacitors arranged in the second loop, and wherein the total capacitance of the first loop is different from the total capacitance of the second loop.

15. The method according to claim 14, wherein the coil is used as a receiving coil, and wherein the total capacitance of the first loop and the total capacitance of the second loop are configured such that a B1− field is greater than a B1+ field.

16. The method according to claim 14, wherein the coil is used as a transmitting coil, and wherein the total capacitance of the first loop and the total capacitance of the second loop are configured such that a B1+ field is larger than a B1− field.

* * * * *